US008404511B2

(12) United States Patent
Pan et al.

(10) Patent No.: US 8,404,511 B2
(45) Date of Patent: Mar. 26, 2013

(54) METHOD FOR MAKING A SOLAR CELL

(75) Inventors: Wen-Chueh Pan, Taoyuan County (TW); Feng-Yu Tsai, Taoyuan County (TW); Kong-Wei Cheng, Taoyuan County (TW); Sheng-Ming Yeh, Taoyuan County (TW); Hung-Chuan Hsu, Taoyuan County (TW); Zan-Yu Chen, Taoyuan County (TW)

(73) Assignee: Chung-Shan Institute of Science and Technology, Armaments, Bureau, Ministry of National Defense, Taoyuan County (TW)

( * ) Notice: Subject to any disclaimer, the term of this patent is extended or adjusted under 35 U.S.C. 154(b) by 113 days.

(21) Appl. No.: 12/973,946

(22) Filed: Dec. 21, 2010

(65) Prior Publication Data
US 2012/0156821 A1 Jun. 21, 2012

(51) Int. Cl.
- *H01L 27/142* (2006.01)
- *H01L 31/032* (2006.01)
- *H01L 31/0749* (2012.01)
- *H01L 21/02* (2006.01)
- *H01L 31/18* (2006.01)

(52) U.S. Cl. ............ 438/72; 438/98; 438/455; 438/85; 438/94

(58) Field of Classification Search ........... 257/E25.007, 257/E25.009, E27.124, E27.125, E27.126, 257/E21.025, E21.034, E21.023; 438/48, 438/57, 84, 85, 93, 94, 95, 64, 106, 761, 438/942, 948, 951, 952, FOR. 455; 136/264
See application file for complete search history.

(56) References Cited

U.S. PATENT DOCUMENTS

| 3,904,945 | A | * | 9/1975 | Hassan et al. | 318/593 |
|---|---|---|---|---|---|
| 4,393,267 | A | * | 7/1983 | Peterson | 136/260 |
| 6,500,733 | B1 | * | 12/2002 | Stanbery | 438/459 |
| 2010/0193018 | A1 | * | 8/2010 | Feist et al. | 136/255 |

* cited by examiner

*Primary Examiner* — Olik Chaudhuri
*Assistant Examiner* — Quovaunda V Jefferson
(74) *Attorney, Agent, or Firm* — Jackson IPG PLLC

(57) ABSTRACT

Disclosed is a method for making a solar cell. In the method, there are provided first and second substrates each including first and second faces. There are provided first and second coating devices and a joining device. The first coating device is used to form a transparent electrode layer on the first face of the first substrate. The second coating device is used to form an absorbing layer on the first face of the second substrate. The second substrate is selenized by hot pressing. The joining device is used to join together the first and second substrates by joining the transparent electrode layer with the absorbing layer. The transparent electrode layer is joined with the absorbing layer by hot pressing. Thus, the solar cell is not made by coating one layer on another. Time for making the solar cell is reduced.

17 Claims, 11 Drawing Sheets

METHOD FOR MAKING A SOLAR CELL

BACKGROUND OF INVENTION

1. Field of Invention

The present invention relates to a method for making a solar cell and, more particularly, to a method including the steps of coating various layers of a solar cell on different substrates and joining together the laminates, thus making the solar cell efficiently.

2. Related Prior Art

As the population of the world is growing, the consumption of energy is increasing while the reserve of fossil fuel including gasoline, natural gas and coal is declining. Moreover, the environmental pollution is getting worse. Hence, many efforts are made to use renewable energy. To use various types of the renewable energy, there are various types of devices such as fuel cells, solar cells, wind turbines and damps. Compared with a power plant based on wind turbines or a damp, the cost for constructing a power plant based on solar cells is low and the area of the power plant based on the solar cells is small. Hence, solar energy seems the most promising type of the renewable energy.

Generally, the operation of the solar cells is based on semiconductor materials that generate electricity after they absorb sun light. Based on materials and techniques, the solar cells can be classified as chip-type solar cells and thin-film solar cells. A chip-type solar cell includes a p-type semiconductor silicon chip that goes through superficial etching, p-n junction diffusion, anti-reflection film coating and electrode making by screen printing. There is however a serious problem with the use of a chip-type solar cell. The amount of the electricity generated by a chip-type solar cell is less than the amount of electricity consumed to make it.

On the other hand, a thin-film solar cell includes various films made of various materials that generate electricity after they absorb sun light. For example, referring to FIG. 1, a thin-film solar cell 9 includes various films formed on a substrate 90. To make the solar cell 9, a Mo metal layer 91 is formed on the substrate 90 before an absorbing layer 92 is formed on the Mo metal layer 91. A CdS layer 93 is formed on the absorbing layer 92 before an intrinsic ZnO ("i-ZnO) layer 94 is coated on the CdS layer 93. Then, a ZnO:Al ("AZO") layer 95 is formed on the i-ZnO layer 94. Finally, an anti-reflection layer 96 and an external electrode 97 are formed on the AZO layer 95.

Generally, the substrate 90 can be made of soda-lime glass. The absorbing layer 92 is made of a p-type semiconductor material such as CIS or CIGS. The AZO layer 95 can be made of an n-type semiconductor material. That is, the structure of the solar cell is a structure based on a p-n junction. The CdS layer 93 can be called the "buffering layer" to increase the absorption efficiency. Moreover, because a semiconductor surface is reflective, all of the sun light does not enter the solar cell 9. That is, there is loss of sun light. Hence, the anti-reflection layer 96 can be made of $MgF_2$ for example to increase the proportion of the sun light that enters the solar cell 9.

The present invention is therefore intended to obviate or at least alleviate the problems encountered in prior art.

SUMMARY OF INVENTION

An objective of the present invention is to provide an efficient method for making a solar cell by coating various layers of a solar cell on different substrates and joining together the laminates.

Another objective of the present invention is to provide an environmentally friendly method for making a solar cell without using Cd.

Another objective of the present invention is to provide an efficient method for making a solar cell by wherein selenizing is conducted by hot pressing.

To achieve the foregoing objective, the method includes the steps of providing first and second substrates, first and second coating devices and a joining device. Each of the first and second substrates includes first and second faces. The first coating device is used to form a transparent electrode layer on the first face of the first substrate. The second coating device is used to form an absorbing layer on the first face of the second substrate. The joining device is used to join together the first and second substrates by joining the transparent electrode layer with the absorbing layer.

In an aspect, the step of forming the transparent electrode layer on the first face of the first substrate includes the step of forming a transparent conductive material layer on the first face of the first substrate, the step of forming a coating-resisting material layer on each of the first and second faces of the first substrate, the step of forming a buffering material layer on the coating-resisting material layer and the transparent conductive material layer, the step of removing the coating-resisting material layer so that the buffering material layer exposes a portion of the transparent conductive material layer, and the step of forming a pattern on the transparent conductive material layer and the buffering material layer to respectively form the transparent electrode layer and the buffering layer so that the transparent electrode layer exposes a portion of the first substrate.

In the previous aspect, the step of forming a pattern on the transparent conductive material layer and the buffering material layer includes the step of using laser scribing.

In another aspect, the step of forming an absorbing layer on the first face of the second substrate includes the step of forming a back electrode-used material layer on the first face of the second substrate, the step of forming a pattern on the back electrode-used material layer to form a back electrode layer that exposes a portion of the second substrate, and the step of forming the absorbing layer on the back electrode layer so that the absorbing layer exposes a portion of the back electrode layer and a portion of the first face of the second substrate.

In another aspect, the step of forming the transparent electrode layer on the first face of the first substrate includes the step of forming a transparent conductive material layer on the first face of the first substrate, the step of forming a coating-resisting material layer on the second face of the first substrate, the step of forming a buffering material layer on the coating-resisting material layer and the transparent conductive material layer, the step of removing the coating-resisting material layer so that the buffering material layer exposes a portion of the transparent conductive material layer, and the step of forming a pattern on the transparent conductive material layer and the buffering material layer to respectively form the transparent electrode layer and the buffering layer so that the transparent electrode layer exposes a portion of the first substrate.

In the previous aspect, the step of forming a pattern on the transparent conductive material layer and the buffering material layer includes the step of using laser scribing.

In another aspect, the step of forming an absorbing layer on the first face of the second substrate includes the step of forming a back electrode-used material layer on the first face of the second substrate, the step of forming a pattern on the back electrode-used material layer to form a back electrode layer that exposes a portion of the second substrate, and the step of forming the absorbing layer on the back electrode layer so that the absorbing layer exposes a portion of the back electrode layer and a portion of the first face of the second substrate.

In another aspect, the step of forming the transparent electrode layer on the first face of the first substrate includes the step of forming a transparent conductive material layer on the first face of the first substrate, the step of forming a coating-resisting material layer on the second face of the first substrate, the step of forming a buffering material layer on the transparent conductive material layer formed on the first face of the first substrate, and the step of forming a pattern on the transparent conductive material layer and the buffering material layer to respectively form the transparent electrode layer and the buffering layer. The transparent conductive material layer exposes a portion of the first substrate. The buffering layer exposes a portion of the transparent electrode layer.

In the previous aspect, the step of forming a pattern on the transparent conductive material layer and the buffering material layer includes the step of using laser scribing.

In the previous aspect, the step of forming the buffering material layer includes the step of using chemical bath deposition.

In the previous aspect, the method further includes the step of forming an additional buffering layer on the absorbing layer. The step of forming the absorbing layer and the additional buffering layer on the first face of the second substrate includes the step of forming a back electrode-used material layer on the first face of the second substrate, the step of forming a pattern on the back electrode-used material layer to form a back electrode layer that exposes a portion of the second substrate, the step of forming an absorbing material layer on the back electrode layer so that the absorbing material layer is in contact with the first face of the second substrate, the step of forming an additional coating-resisting material layer on the second face of the second substrate, the step of forming an additional buffering material layer on the absorbing material layer, and the step of forming a pattern on the additional buffering material layer and the additional coating-resisting material layer to respectively form an additional buffering layer and an additional absorbing layer that expose a portion of the back electrode layer.

In another aspect, the step of forming the additional buffering material layer includes the step of using chemical bath deposition.

In another aspect, the step of forming the conductive paste between the first and second substrates includes the step of using a screen printing step or a dispensing step.

In another aspect, the step of joining together the first and second substrates includes the step of using hot pressing.

In another aspect, the method further includes the step of providing an isolative layer between the first and second substrates.

In another aspect, the joining device includes a positioning module and a hot pressing module. The positioning module is used for taking a positioning step for positioning the first substrate relative to the second substrate and providing a positioning signal based on the positioning step. The hot pressing module is used for receiving the positioning signal and accordingly taking a hot pressing step to join together the first and second substrates. The first face of the first substrate is in contact with the first face of the second substrate.

In another aspect, the step of joining together the first and second substrates by hot pressing includes the step of forming an absorbing layer on the first substrate, the step of forming a buffering layer on the absorbing layer formed on the first substrate, the step of forming a transparent electrode layer on the second substrate, the step of forming a buffering layer on the transparent electrode layer formed on the second substrate, and the step of joining the buffering layer formed on the absorbing layer formed on the first substrate with the buffering layer formed on the transparent electrode layer formed on the second substrate by hot pressing.

In another aspect, in the step of joining together the first and second substrates by hot pressing, a buffering layer is formed on the transparent electrode layer formed on the first substrate, and the buffering layer is joined with the second substrate by hot pressing. Alternatively, a buffering layer is formed on the absorbing layer formed on the second substrate, and the buffering layer is joined with the first substrate by hot pressing.

In another aspect, in the step of joining together the first and second substrates, the first substrate is provided with material layers that can be joined together by hot pressing to form a buffering layer, and the buffering layer is joined with the second substrate. Alternatively, the second substrate is provided with material layers that can be joined together by hot pressing to form a buffering layer, and the buffering layer is joined with the first substrate.

In another aspect, the step of joining together the first and second substrates by hot pressing includes the step of forming a buffering layer on the transparent electrode layer formed on the first substrate, the step of forming a buffering layer on the absorbing layer formed on the second substrate, and the step of joining together the buffering layers by hot pressing.

In another aspect, an absorbing layer is hot pressed against a layer of selenium so that the absorbing layer is selenized.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings versus the prior art wherein.

DETAILED DESCRIPTION OF EMBODIMENTS

Figure 1:
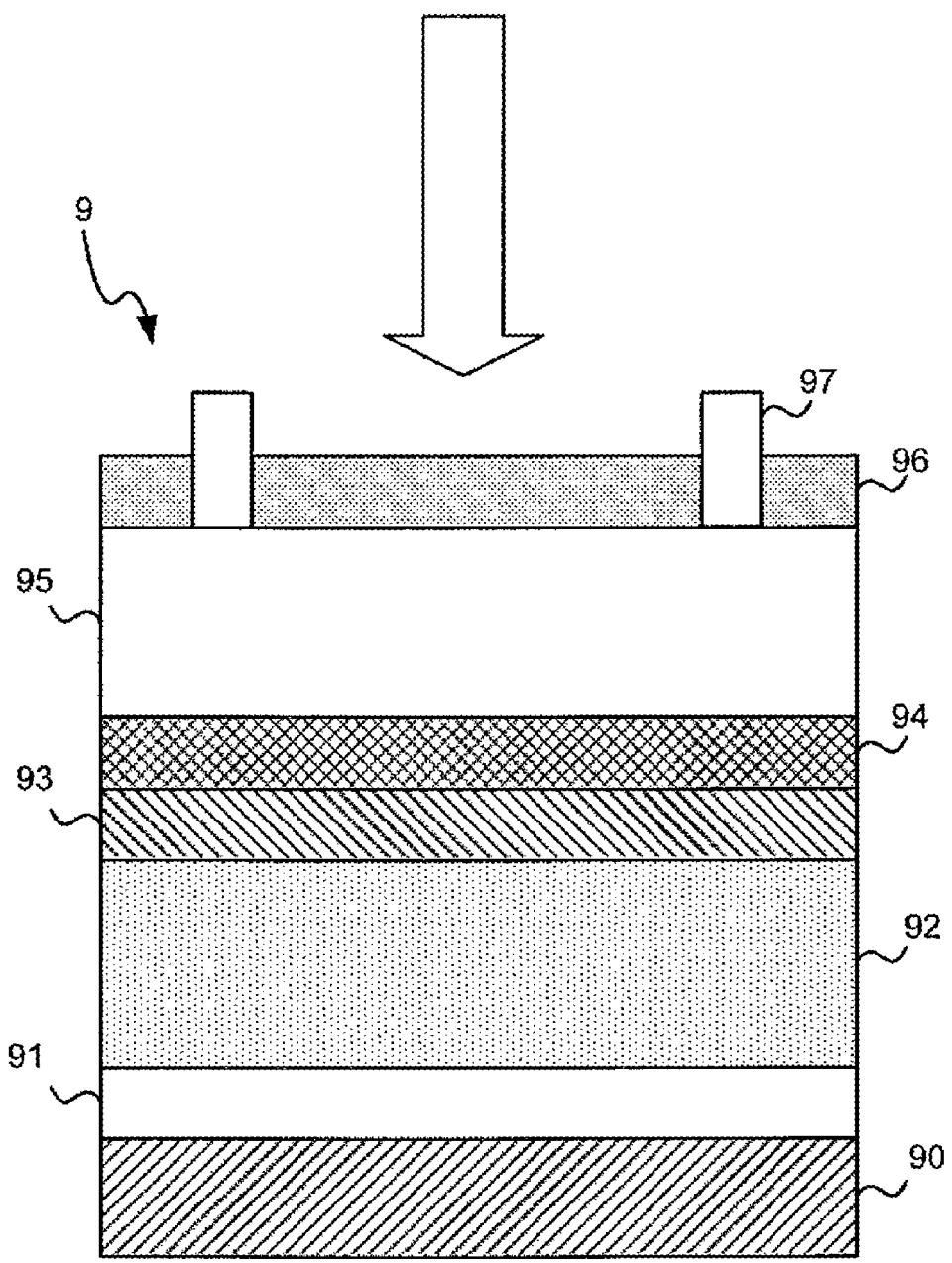
FIG. 1 is a cross-sectional view of a conventional solar.
Figure 2:
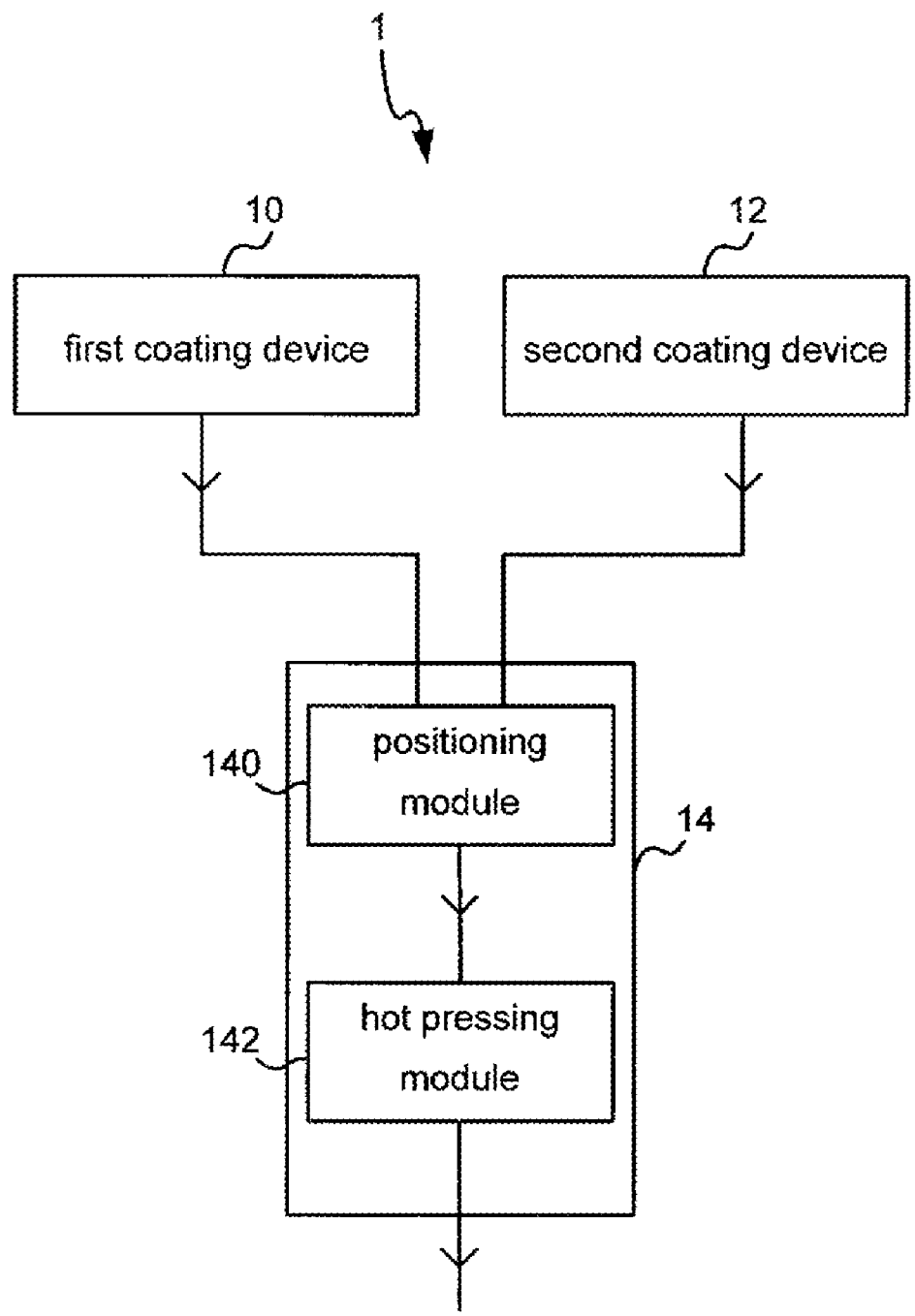
FIG. 2 is a block diagram of a system for realizing a method for making a solar cell according to the present invention.
Figure 3:
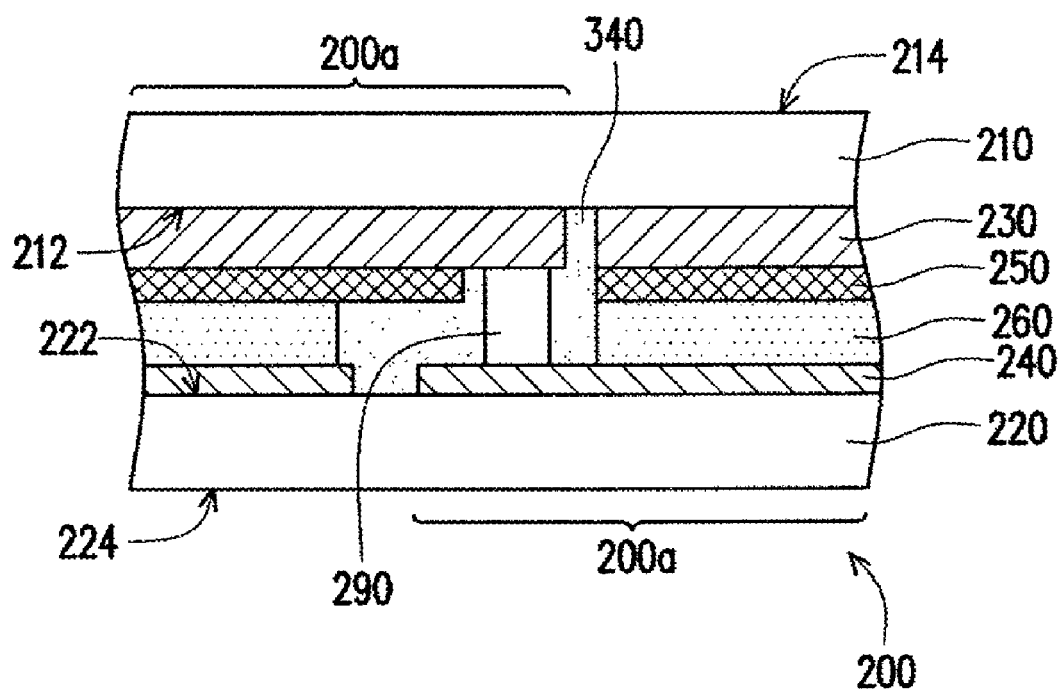
FIG. 3 is a partial, cross-sectional view of the solar cell made by the system shown in FIG. 2.

Referring to FIGS. 2 and 3, there is shown a system 1 for realizing a method for making a solar cell 200 according to the present invention. The system 1 includes a first coating device 10, a second coating device 12 and a joining device 14. The first coating device 10 is used to coat a first substrate 210 with a transparent electrode layer 230 and a buffering layer 250. The first substrate 210 is formed with two opposite faces 212 and 214. The transparent electrode layer 230 and the buffering layer 250 are located on the face 212.

The second coating device 12 is used to coat a second substrate 220 with a back electrode layer 240 and an absorbing layer 260. The second substrate 220 is formed with two opposite faces 222 and 224. The back electrode layer 240 and the absorbing layer 260 are located on the face 222.

The joining device 14 is used to join the first substrate 210 with the second substrate 20. The face 212 is in contact with the face 222. In practice, the joining device 14 can include a positioning module 140 and a hot pressing module 142. The positioning module 140 is used to position the first substrate 210 relative to the second substrate 220 and provide a positioning signal based on the positioning. The hot pressing module 142 is connected to the positioning module 140. The hot pressing module 142 is used to receive the positioning signal and hot press the first substrate 210 against the second substrate 220, thus joining the first substrate 210 with the second substrate 220.

Figure 4:
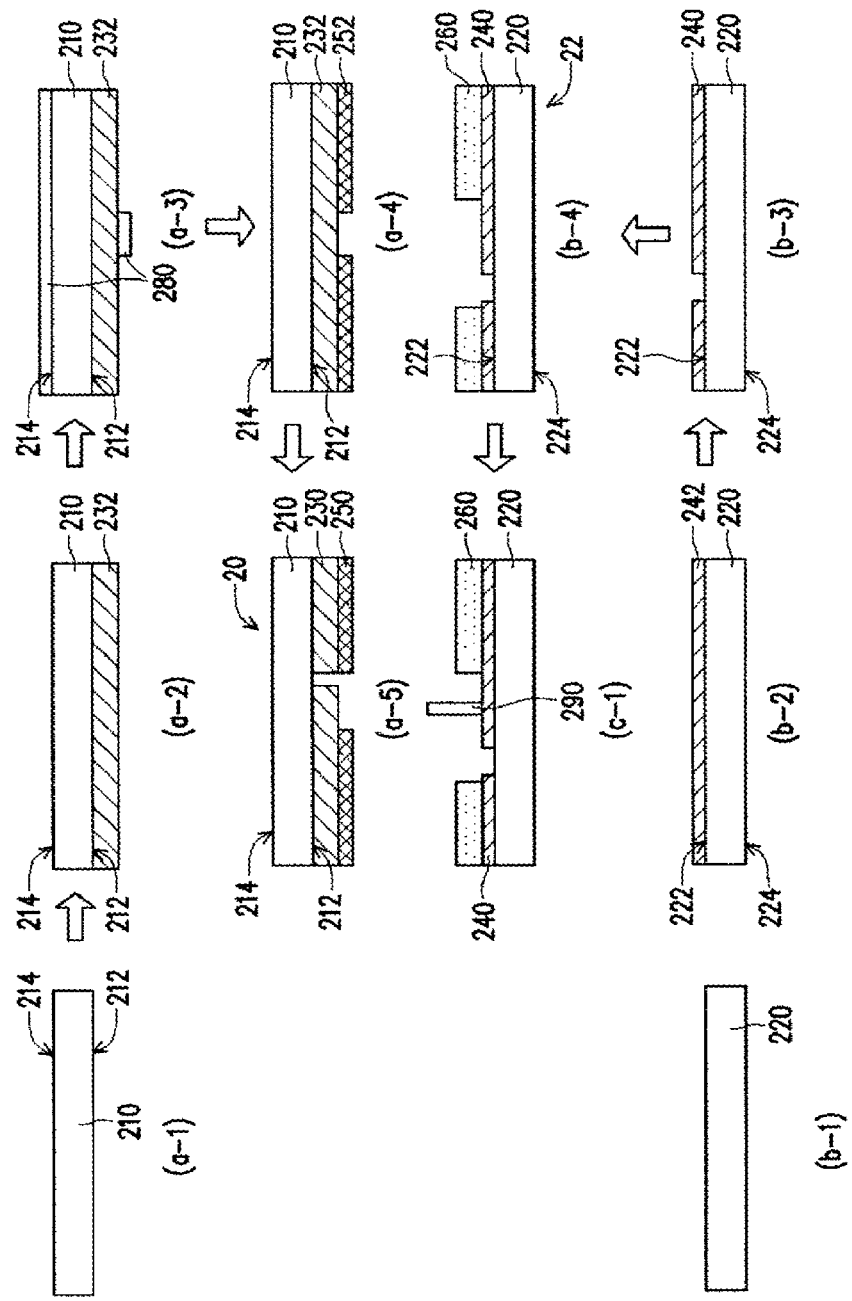
FIG. 4 shows components of the solar cell at various stages of a method according to a first embodiment of the present invention.

Preferably, the first coating device 10 and the second coating device 12 synchronously execute their tasks. After the coating, the first coating device 10 provides the first substrate 210 to the joining device 14, and the second coating device 12 provides the second substrate 220 to the joining device 14. The laminate including the first substrate 210 is taken as the first laminate 20 (FIG. 4), and the laminate including the second substrate 220 is taken as the second laminate 22 (FIG. 4). The first laminate 20 can be joined with the second laminate 22 to provide the solar cell 200.

To further describe, in detail, the structures of the first laminate 20 and the second laminate 22 and how the solar cell 200 can be made, steps taken to make the solar cell 200 will be described later.

Referring to FIG. 4, there is shown a method for making the solar cell 200 according to a first embodiment of the present invention. Steps represented by a-1 to a-5 are taken to make the first laminate 20, and steps represented by b-1 to b-4 are taken to make the second laminate 22.

At a-1, a proper plastic material is chosen for the first substrate 210.

At a-2, a transparent conductive material layer 232 is formed on the face 12 of the first substrate 210. The transparent conductive material layer 232 includes an AZO layer and an i-ZnO layer. The AZO layer can be made of a n-type semiconductor material while the i-ZnO layer can be made of a non-dosed semiconductor material. Alternatively, the transparent conductive material layer 232 can be made of indium-tin oxide ("ITO"), indium-zinc oxide ("IZO"), indium-tin-zinc oxide, $HfO_2$, ZnO, $Al_2O_3$, aluminum-tin oxide, aluminum-zinc oxide, cadmium-tin oxide and/or cadmium-zinc oxide. Preferably, the transparent conductive material layer 232 includes the AZO layer and the i-ZnO layer. However, the components of the transparent conductive material layer 232 are not limited to those described above.

At a-3, a coating-resisting material layer 280 is formed on the face 214 of the first substrate 210 while another coating-resisting material layer 280 is formed on the transparent conductive material layer 232. The coating-resisting material layers 280 can be made of a metal or non-metal material. The coating-resisting material layers 280 can be provided by adhesion, deposition, vapor coating or sputtering. Alternatively, the coating-resisting material layers 280 can be made of a photo-resist material. The coating-resisting material layers 280 are used to prevent a buffering material from contaminating the face 214 of the first substrate 210 and at least one portion of the transparent conductive material layer 232 in the following steps.

At a-4, a buffering material layer 252 is formed on the transparent conductive material layer 232. At first, the buffering material layer 252 covers the transparent conductive material layer 232 and the coating-resisting material layer 280. Then, the coating-resisting material layer 280 is removed so that the buffering material layer 252 exposes a portion of the transparent conductive material layer 232. The buffering material layer 252 can be formed by spay pyrolysis, chemical bath deposition ("CBD") or any other proper means. CBD is preferred. That is, while the buffering material layer 252 is formed on the transparent conductive material layer 232 by CBD, a pattern is made on the buffering material layer 252 via the coating-resisting material layer 280 so that the buffering material layer 252 is only formed on an predetermined portion of the transparent conductive material layer 232.

At a-5 shown in FIG. 4, a pattern is made on the transparent conductive material layer 232 and another pattern is made on the buffering material layer 252. The transparent conductive material layer 232 exposes a portion of the first substrate 210. The patterns are made on the transparent conductive material layer 232 and the buffering material layer 252 by laser scribing. Thus, the transparent conductive material layer 232 at A-4 is turned into the transparent electrode layer 230 at A-5 while the buffering material layer 252 at A-4 is turned into the buffering layer 250 at A-5. The first laminate 20 of the solar cell 200 is made after the steps represented by a-1 to a-5 are taken.

Referring to FIG. 4, to make the second laminate 22, at b-1, the second substrate 220 is provided. The second substrate 220 can be made of stainless steel, aluminum, $TiO_2$, soda-lime glass, polymer or any other proper material.

At b-2, a back electrode-used material layer 242 is formed on the face 222 of the second substrate 220. The back electrode-used material layer 242 can be made of a material for excellent ohm contact with the absorbing layer 260. For example, the back electrode-used material layer 242 can be a Mo metal film if the absorbing layer 260 is made of CIS or CIGS. Generally, the absorbing layer 260 can be made of $CuInS_2$, $CuGaS_2$, $CuGaSe_2$ or any other proper material than the CIS and CIGS if the absorbing layer 260 is a p-type semiconductor.

At b-3, the pattern is made on the back electrode-used material layer 242 to form the back electrode layer 240 that exposes a portion of the face 222 of the second substrate 220. The pattern can be formed on the back electrode-used material layer 242 by laser scribing.

At b-4, the absorbing layer 260 is formed on the back electrode layer 240. The absorbing layer 260 exposes a portion of the face 222 of the second substrate 220 and a portion of the back electrode layer 240. The absorbing layer 260 can be formed by gravure, electro-deposition of a metal layer, tensioned-web slot coating ("TWSC"), ink-jet printing or any other proper means. These means are given for exemplary purposes only, not for limitation. The second laminate 22 is completed after the steps represented by b-1 to b-4 are taken.

After the steps represented by a-1 to a-5 and b-1 to b-4 are taken, the first laminate 20 is joined with the second laminate 22. At c-1, a film 290 of conductive paste is provided between the first substrate 210 and the second substrate 220. The first substrate 210 (or the first laminate 20) is joined with the second substrate 220 (or the second laminate 22) by the joining device 14. The transparent electrode layer 230 attached to the first substrate 210 is electrically connected to the back electrode layer 240 attached to the second substrate 220 by the film 290 of conductive paste. The face 212 is in contact with the face 222. The film 290 of conductive paste is provided by screen printing silver paste on the second substrate 220 for example. Means for providing the film 290 of conductive paste is however not limited to the screen printing of silver paste. Moreover, the first substrate 210 (or the first laminate 20) is joined with the second substrate 220 (or the second laminate 22) by hot pressing for example.

Because the film 290 of conductive paste electrically connects the transparent electrode layer 230 to the back electrode layer 240, various photovoltaic units 200a of the solar cell 200 are electrically connected to one another in series. Now, the solar cell 200 is completed. It should be noted that the steps represented by a-1 to a-5 can be taken synchronously or sequentially with the steps represented by b-1 to b-4. That is, the sequence of the forming of the first laminate 20 and the second laminate 22 can be determined based on a user's need and is not limited.

As mentioned above, the solar cell 200 is made by joining the first laminate 20 with the second laminate 22. The first laminate 20 and the second laminate 22 can be made synchronously before they are joined together. Therefore, the system 1 can be used to produce the solar cell 200 efficiently.

Figure 5:
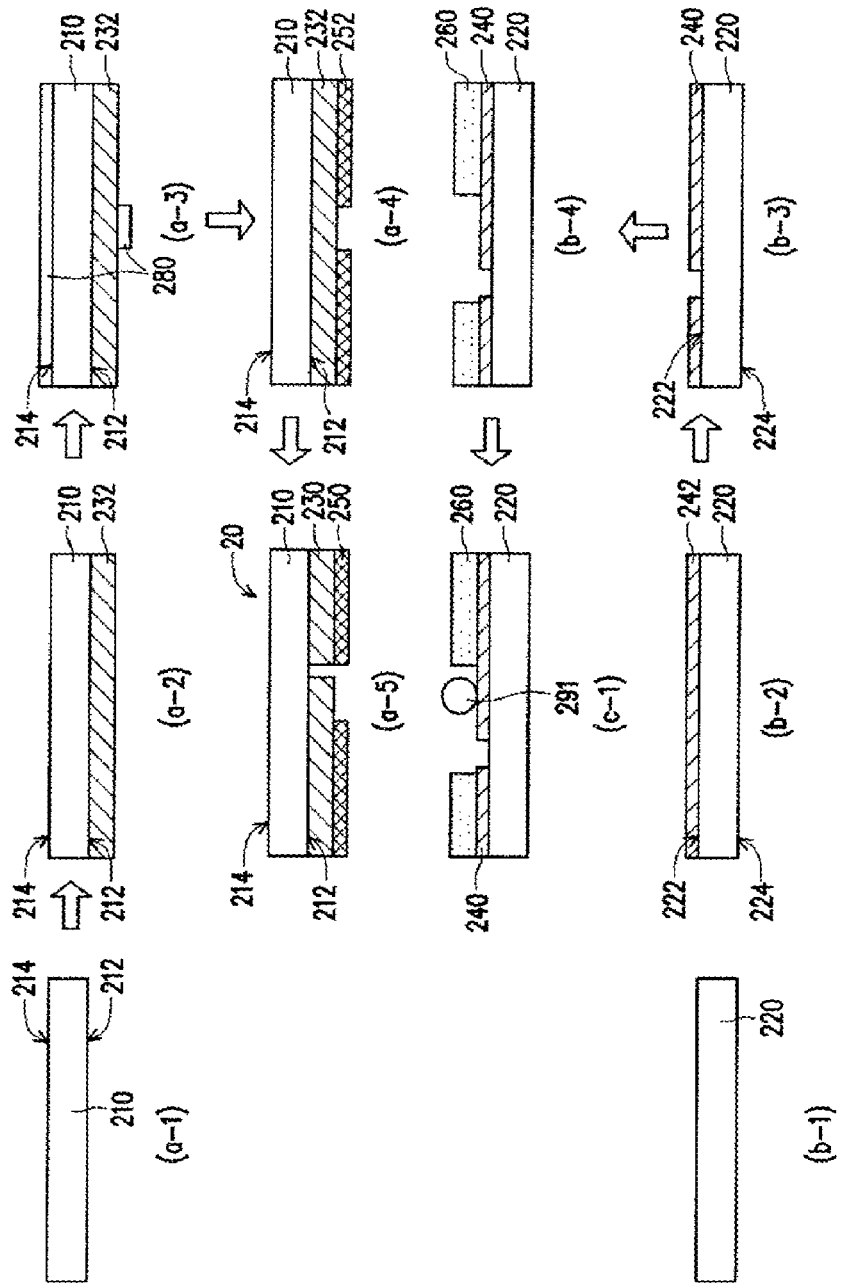
FIG. 5 shows components of the solar cell at various stages of a method according to a second embodiment of the present invention.

Referring to FIG. 5, there is shown a method for making the solar cell 200 according to a second embodiment of the present invention. The steps represented by a-1 to a-5 are taken to make the first laminate 20, and the steps represented by b-1 to b-4 are taken to make the second laminate 22. The second embodiment is like the first embodiment except using a dispensing robot to provide a dot 291 of conductive paste on the second substrate 220 at the step represented by c-1. The dot 291 of conductive paste is provided on the second substrate 220 for exemplary purposes, not for limitation. Hence, the method shown in FIG. 5 can be used to make the solar cell 200. The method shown in FIG. 5 exhibits the same advantages as the method shown in FIG. 4.

Figure 6:
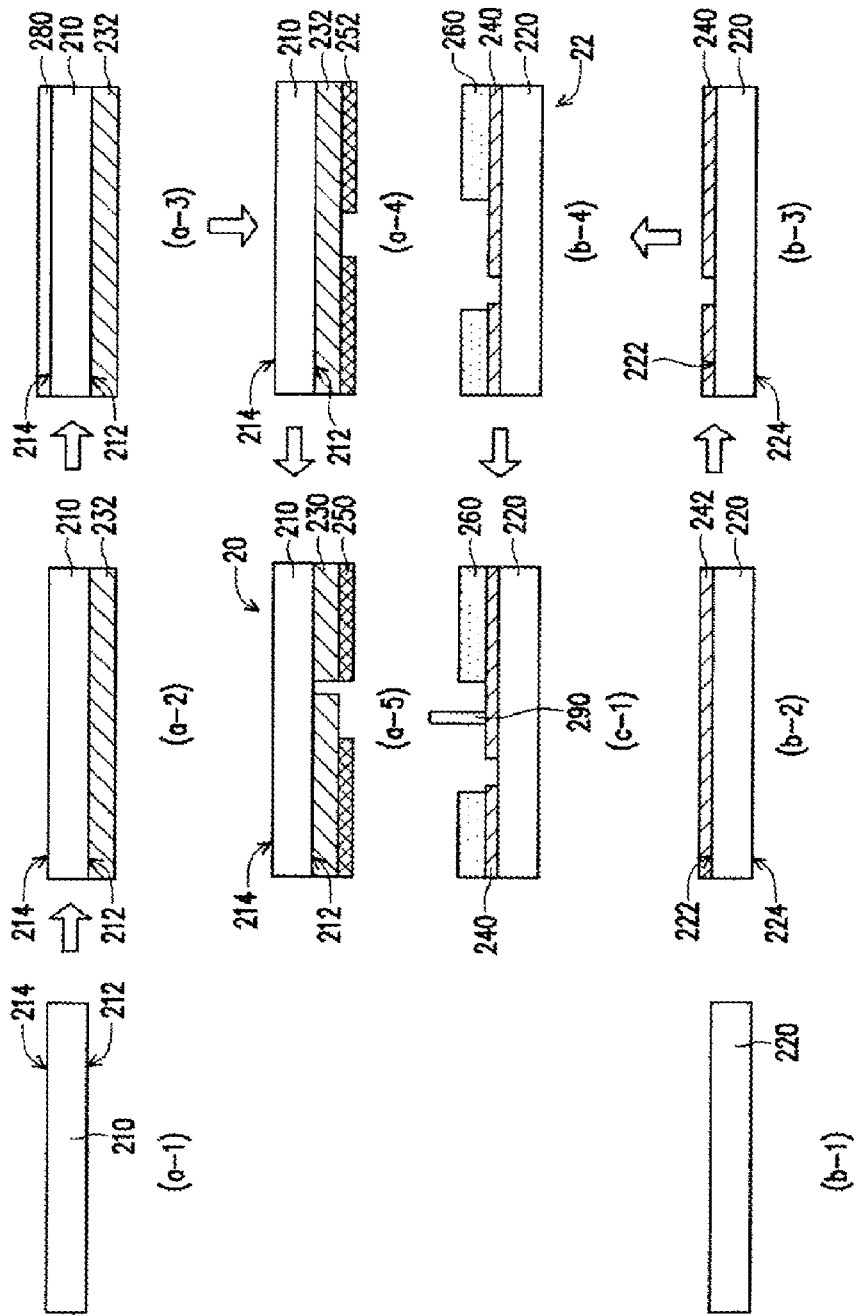
FIG. 6 shows components of the solar cell at various stages of a method according to a third embodiment of the present invention.

Referring to FIG. 6, there is shown a method for making the solar cell 200 according to a third embodiment of the present invention. The steps represented by a-1 to a-5 are taken to make the first laminate 20, and the steps represented by b-1 to b-4 are taken to make the second laminate 22. The third embodiment is like the first embodiment except including two steps instead of the steps represented by a-3 and a-4 as shown in FIG. 4.

At a-3 shown in FIG. 6, a coating-resisting material layer 280 is provided on the face 214 of the first substrate 210 only. The coating-resisting material layer 280 can be made of a metal or non-metal material. The coating-resisting material layer 280 can be provided by adhesion, deposition, vapor coating or sputtering. Alternatively, the coating-resisting material layer 280 can be made of a photo-resist material. The coating-resisting material layer 280 is used to prevent a buffering material from contaminating the face 214 of the first substrate 210 and at least one portion of the transparent conductive material layer 232 in the following steps.

At a-4 shown in FIG. 6, a buffering material layer 252 is formed on the face 212 of the first substrate 210, and a pattern is formed on the buffering material layer 252 synchronously so that the buffering material layer 252 exposes at least one portion of the transparent conductive material layer 232. The buffering material layer 252 is formed by spray pyrolysis, CBD or any other proper means. Preferably, spray pyrolysis is used. Moreover, the pattern is formed on the buffering material layer 252 by laser scribing for example so that the buffering material layer 252 exposes at least one portion of the transparent conductive material layer 232. That is, the pattern is defined by the laser scribing at the step represented by a-4 in FIG. 6 while the pattern is defined by the coating-resisting material layer 280 at the step represented by a-4 in FIG. 4.

As discussed above, the method shown in FIG. 5 can be used to make the solar cell 200. The method shown in FIG. 6 exhibits the same advantages as the method shown in FIG. 4.

Figure 7:
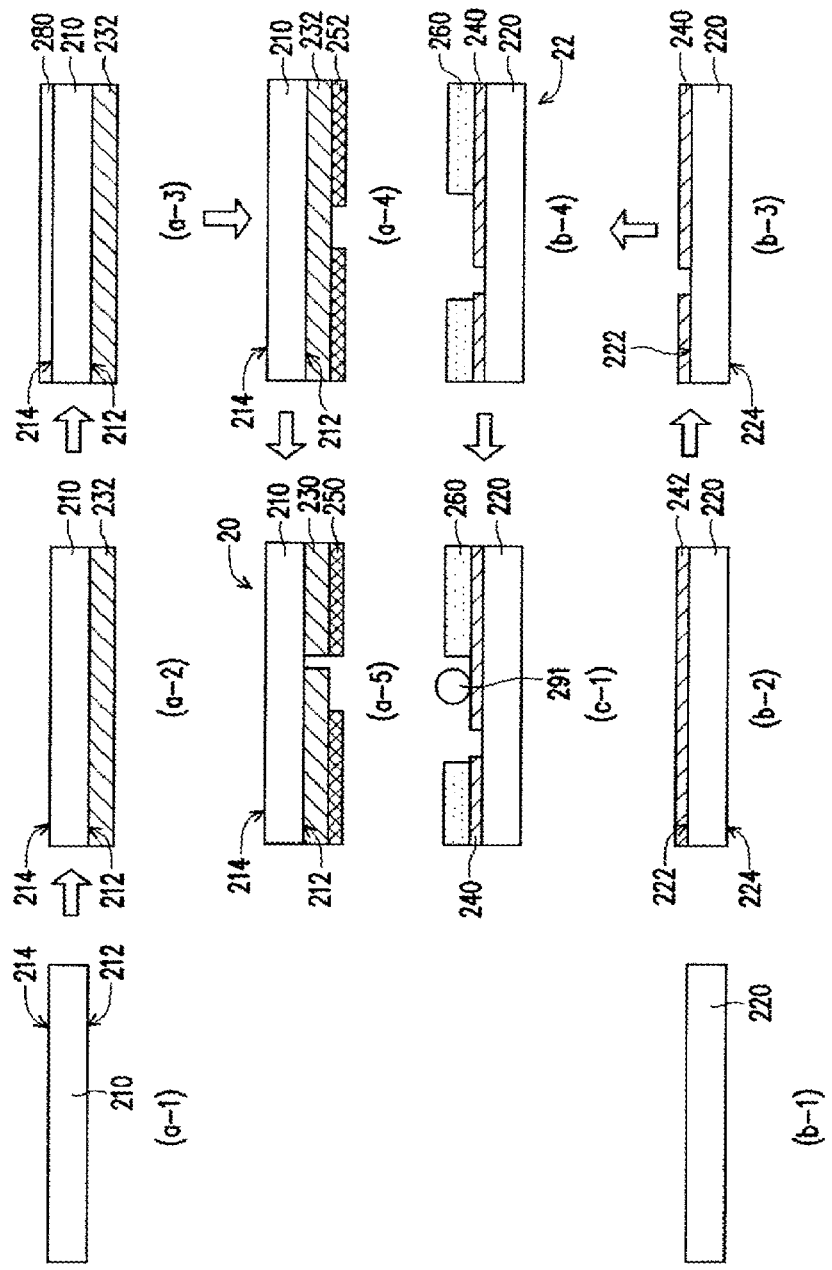
FIG. 7 shows components of the solar cell at various stages of a method according to a fourth embodiment of the present invention.

Referring to FIG. 7, there is shown a method for making the solar cell 200 according to a fourth embodiment of the present invention. The steps represented by a-1 to a-5 are taken to make the first laminate 20, and the steps represented by b-1 to b-4 are taken to make the second laminate 22. The fourth embodiment is like the third embodiment except using a dispensing robot to provide a dot 291 of conductive paste on the second substrate 220 at the step represented by c-1. The dot 291 of conductive paste is provided on the second substrate 220 for exemplary purposes, not for limitation. Hence, the method shown in FIG. 7 can be used to make the solar cell 200. The method shown in FIG. 7 exhibits the same advantages as the method shown in FIG. 6.

Figure 8:
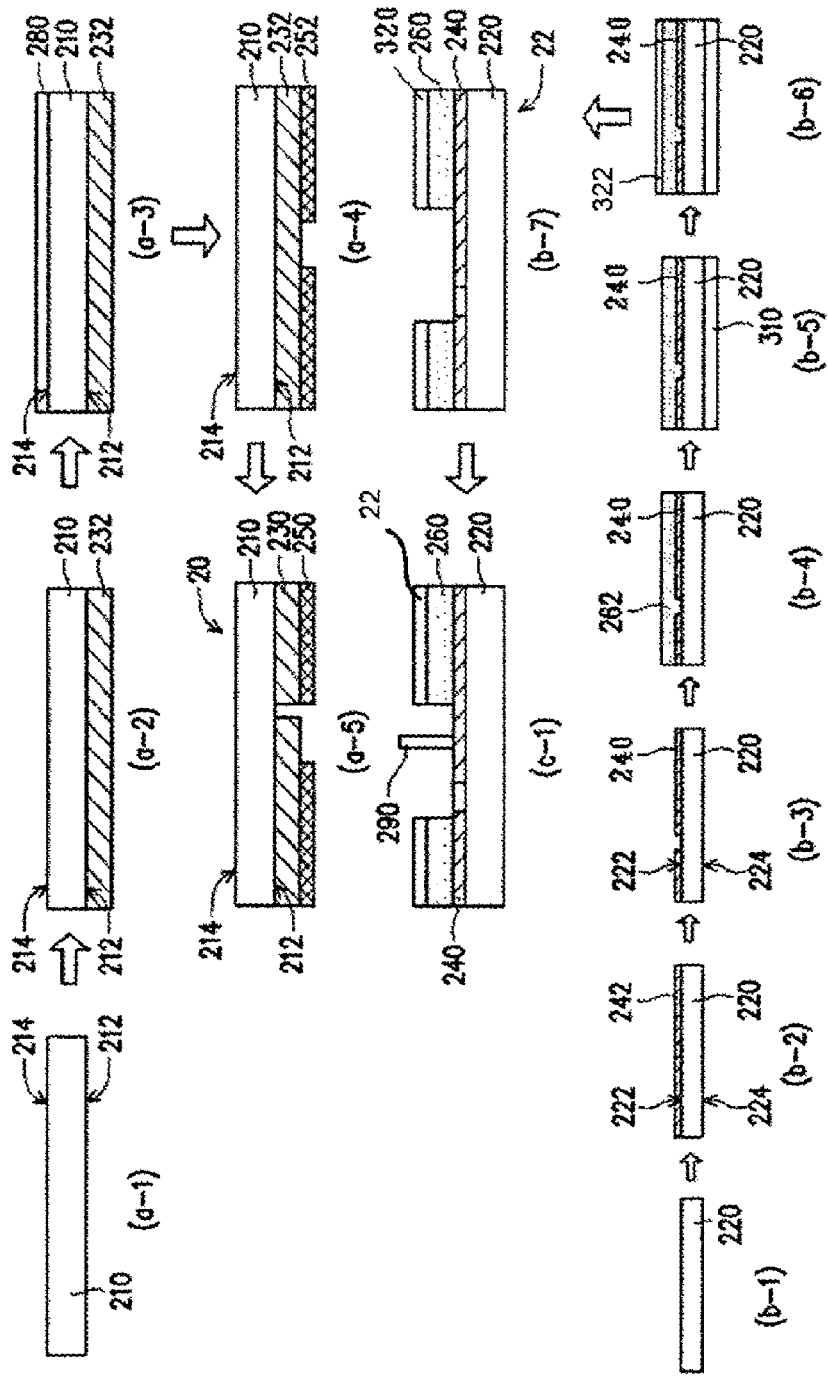
FIG. 8 shows components of the solar cell at various stages of a method according to a fifth embodiment of the present invention.

Referring to FIG. 8, there is shown a method for making the solar cell 200 according to a fifth embodiment of the present invention. The steps represented by a-1 to a-5 are taken to make the first laminate 20, and the steps represented by b-1 to b-4 are taken to make the second laminate 22. The fifth embodiment is like the third embodiment except using a different process for making the second laminate 22.

At b-1, the second substrate layer 220 is provided. The second substrate 220 can be made of stainless steel, aluminum, $TiO_2$, soda-lime glass, polymer or any other proper material.

At b-2, the back electrode-used material layer 242 is formed on the face 222 of the second substrate 220. The back electrode-used material layer 242 can be made of a material for excellent ohm contact with the absorbing layer 260. For example, the back electrode-used material layer 242 can be a Mo metal film if the absorbing layer 260 is made of CIS or CIGS. Generally, the absorbing layer 260 can be made of $CuInS_2$, $CuGaS_2$, $CuGaSe_2$ or any other proper material than the CIS and CIGS if the absorbing layer 260 is made of a p-type semiconductor material.

At b-3, the pattern is made on the back electrode-used material layer 242 to form the back electrode layer 240 that exposes a portion of the face 222 of the second substrate 220. The pattern can be formed on the back electrode-used material layer 242 by laser scribing.

At b-4, an additional absorbing material layer 262 is formed on the back electrode layer 240. The additional absorbing material layer 262 is in contact with a portion of the face 222 of the second substrate 220. The additional absorbing material layer 262 can be formed by gravure, electro-deposition of a metal layer, tensioned-web slot coating ("TWSC"), ink-jet printing or any other proper means. These means are given for exemplary purposes only, not for limitation. The second laminate 22 is completed after the steps represented by b-1 to b-4 are taken.

At b-5, an additional coating-resisting material layer 310 is formed on the face 224 of the second substrate 220. The additional coating-resisting material layer 310 is formed on the face 224 of the second substrate 220 shown in FIG. 8 like the coating-resisting material layer 280 is formed on the face 224 of the second substrate 220 shown in FIG. 4.

At b-6, an additional buffering material layer 322 is formed on the absorbing material layer 262. The additional buffering material layer 322 is formed in the same manner as the buffering material layer 252 is formed.

At b-7, a pattern is formed on each of the buffering material layer 322 and the absorbing material layer 262 to form an additional buffering layer 320 and an additional absorbing layer 260 that expose at least one portion of the back electrode layer 240. Preferably, the additional buffering material layer 322 and the additional absorbing material layer 262 are made by laser scribing. After the steps represented by b-1 to b-7 are taken, the second laminate 22 is completed.

After the steps represented by a-1 to a-5 and b-1 to b-7 are taken, the first laminate 20 is joined with the second laminate 22. At c-1, a film 290 of conductive paste is provided between the first substrate 210 and the second substrate 220. The first substrate 210 (or the first laminate 20) is joined with the second substrate 220 (or the second laminate 22) by the joining device 14. The transparent electrode layer 230 attached to the first substrate 210 is electrically connected to the back electrode layer 240 attached to the second substrate 220 by the film 290 of conductive paste. The face 212 is in contact with the face 222. The film 290 of conductive paste is provided by screen printing silver paste on the second substrate 220 for example. Means for providing the film 290 of conductive paste are however not limited to the screen printing of silver paste. Moreover, the first substrate 210 (or the first laminate 20) is joined with the second substrate 220 (or the second laminate 22) by hot pressing for example.

Because the film 290 of conductive paste electrically connects the transparent electrode layer 230 to the back electrode layer 240, various photovoltaic modules 200a of the solar cell 200 are electrically connected to one another in series. Now, the solar cell 200 is completed. It should be noted that the steps represented by a-1 to a-5 can be executed synchronously or asynchronously with the steps represented by b-1 to b-7. That is, the sequence of the forming of the first laminate 20 and the second laminate 22 can be determined based on a user's need and is not limited.

As mentioned above, as shown in FIG. 8, the solar cell 200 is made by joining the first laminate 20 with the second laminate 22. The first laminate 20 and the second laminate 22 can be made synchronously before they are joined together. Therefore, the system 1 can be used to produce the solar cell 200 efficiently.

It should be noted that the methods shown in FIGS. 4 to 8 can be realized in a non-vacuum continuous production system. Moreover, the foregoing methods are described in relation to a CIGS solar cell for exemplary purposes, not for limitation.

It should also be noted that an isolative layer 340 can be provided between the first substrate 210 and the second substrate 220 after joining the first laminate 20 with the second laminate 22 by hot pressing.

Figure 9:
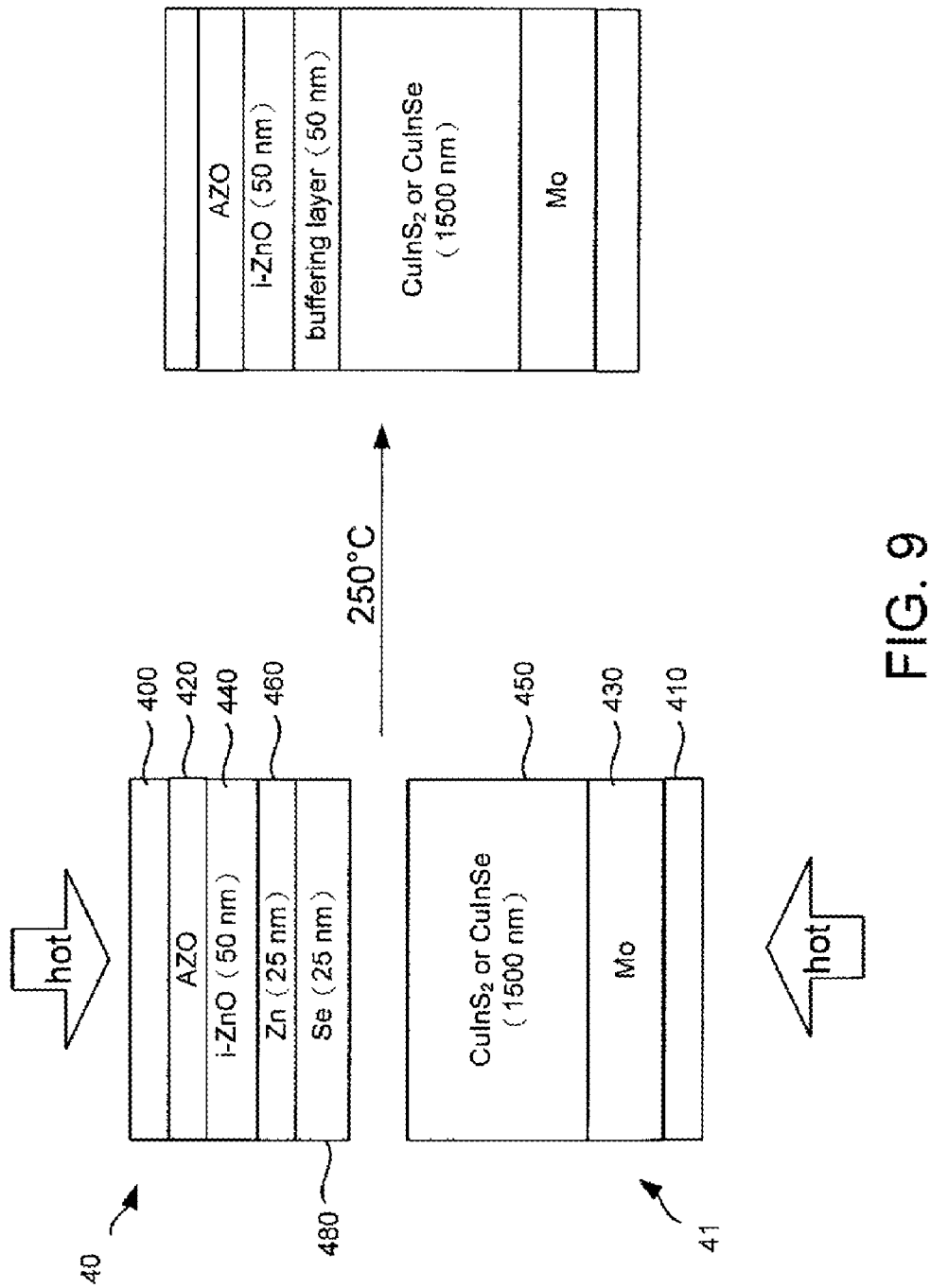
FIG. 9 is a flow chart of the step of selenizing and forming a Cd-free buffer layer of the method.

Referring to FIG. 9, there is shown a selenizing step of the method of the present invention. Preferably, a transparent conductive material layer 420 is formed on a first substrate 400 before an i-ZnO layer 440 is formed on the transparent conductive material layer 420. A zinc layer 460 is formed on the i-ZnO layer 440 before a selenium layer 480 is formed on the zinc layer 460. Thus, a first portion 40 of the CIGS solar cell is made. Then, a second substrate 410 is substantially coated with a back electrode layer 430 of Mo and a CIGS absorbing layer 450. Thus, a second portion 41 of the CIGS solar cell is made. Finally, the selenium layer 480 of the first portion 40 of the CIGS solar cell is joined with the absorbing layer 450 of the second portion 41 of the CIGS solar cell by hot pressing so that the absorbing layer 450 is selenized by reaction with the selenium layer 480. By hot pressing, the selenium layer 480 can further be joined with a zinc layer 460 to form the buffering layer of the solar cell and further joined with the absorbing layer 450 to form a CIGS solar cell. The description referring to FIG. 8 is given in relation to a CIGS solar cell for exemplary purposes, not for limitation.

Figure 10:
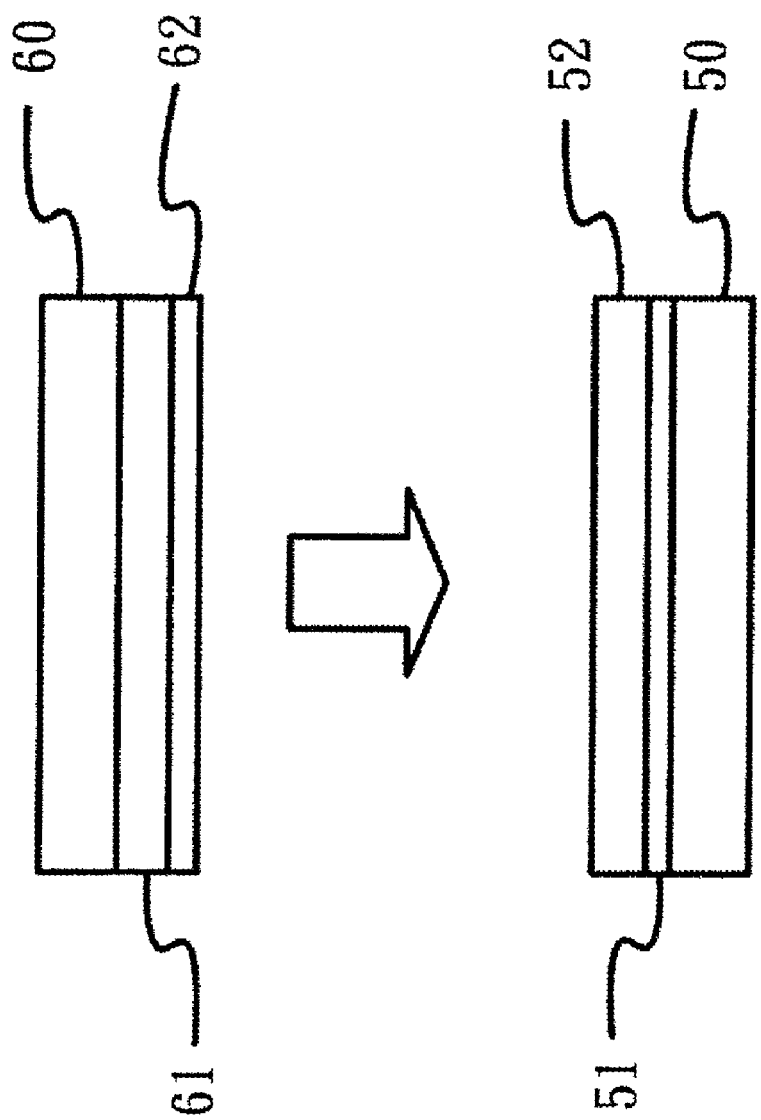
FIG. 10 shows a hot pressing step according to a sixth embodiment of the present invention.

Referring to FIG. 10, there is shown a hot pressing step according to a sixth embodiment of the present invention. A transparent electrode layer 61 is formed on a first substrate 60 before a buffering layer 62 is formed on the transparent electrode layer 61. A back electrode layer 51 is formed on a second substrate 50 before an absorbing layer 52 is formed on the back electrode layer 51. Then, the buffering layer 62 is joined with the absorbing layer 52 by hot pressing so that the second substrate 50 and the first substrate 60 are joined together to form a solar cell. Alternatively, the buffering layer 62 can be formed on the absorbing layer 52 attached to the second substrate 50 before the buffering layer 62 is joined with the transparent 61 attached to the second substrate 60 by hot pressing.

Figure 11:
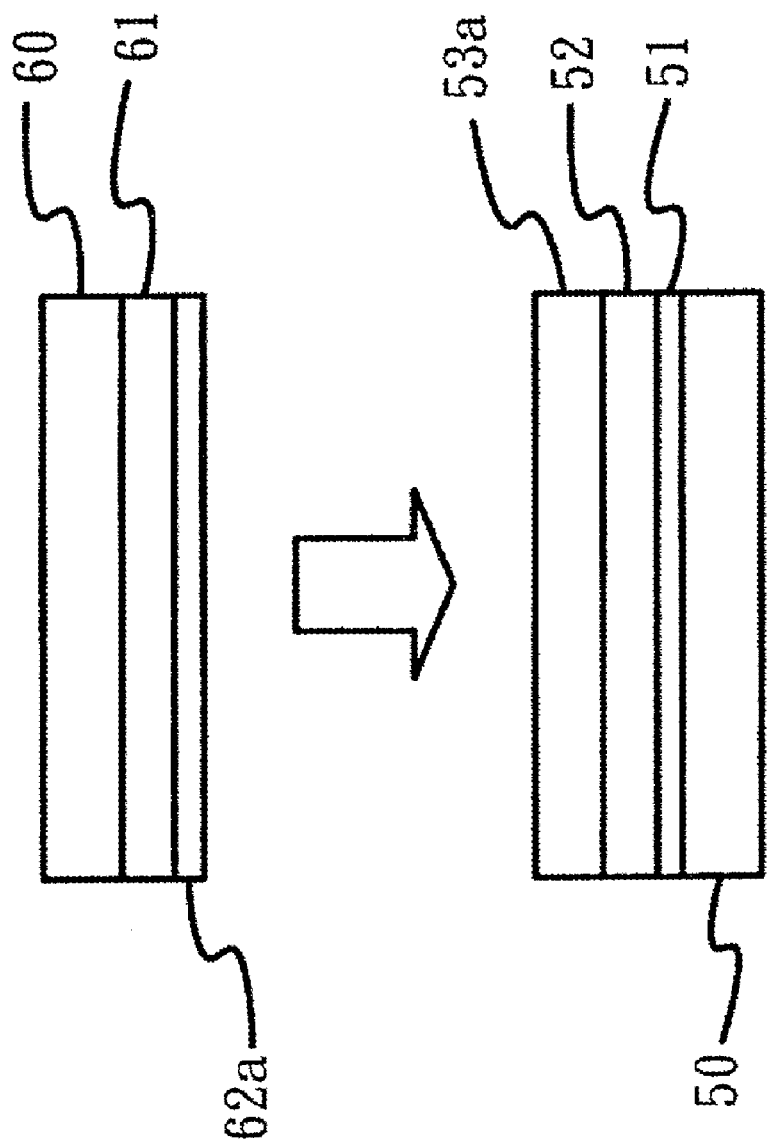
FIG. 11 shows a hot pressing step according to a seventh embodiment of the present invention.

Referring to FIG. 11, there is shown a hot pressing step according to a seventh embodiment of the present invention. A buffering layer 62a is formed on the transparent electrode layer 61 attached to the first substrate 60 while another buffering layer 53a is formed on the absorbing layer 52 attached to the second substrate 50. Then, the buffering layer 53a is joined with the buffering layer 62a by hot pressing so that the second substrate 50 is joined with the first substrate 60 to form a solar cell. The buffering layer 62a or 53a can be made of ZnSe, CdS, ZnS or $In_2S_3$. Alternatively, the buffering material layer can be made of cadmium and phosphor that can react with each other to form the CdS of the buffering layer by hot pressing. Alternatively, the buffering material layer can be made of zinc and phosphor that can react with each other to form the ZnS of the buffering layer by hot pressing. Alternatively, the buffering material layer can be made of indium and phosphor that can react with each other to form the $In_2S_3$ of the buffering layer by hot pressing. These components of the buffering material layer are only given for exemplary purposes, not for limitation.

As discussed above, with the method of the present invention, the solar cell can efficiently be made by forming the first and second laminates synchronously before the first and second laminates are joined together. Furthermore, the present invention provides the system for realizing the method for making the solar cell.

The present invention has been described via the detailed illustration of the embodiments. Those skilled in the art can derive variations from the embodiments without departing from the scope of the present invention. Therefore, the embodiments shall not limit the scope of the present invention defined in the claims.

The invention claimed is:

1. A method for making a solar cell, the method including the steps of:
providing a first substrate (210) with first and second faces (212, 214);
providing a second substrate (220) with first and second faces (222, 224);

providing a first coating device (10) for forming a transparent electrode layer (230) on the first face (212) of the first substrate (210);
providing a second coating device (12) for forming an absorbing layer (260) on the first face (222) of the second substrate (220); and
providing a joining device (14) for joining together the first and second substrates (210, 220) by joining the transparent electrode layer (230) with the absorbing layer (260),
wherein the step of forming the transparent electrode layer (230) on the first face (212) of the first substrate includes the steps of:
forming a transparent conductive material layer (232) on the first face (212) of the first substrate (200);
forming a coating-resisting material layer (280) on each of the first and second faces (212, 214) of the first substrate (210);
forming a buffering material layer (252) on the coating-resisting material layer (280) and the transparent conductive material layer (232);
removing the coating-resisting material layer (280) so that the buffering material layer (252) exposes a portion of the transparent conductive material layer (232), and
forming a pattern on the transparent conductive material layer (232) and the buffering material layer (252) to respectively form the transparent electrode layer (230) and the buffering layer (250) so that the transparent electrode layer (230) exposes a portion of the first substrate (210).

2. The method according to claim 1, wherein the step of forming a pattern on the transparent conductive material layer (232) and the buffering material layer (252) includes the step of using laser scribing.

3. The method according to claim 1, wherein the step of forming an absorbing layer (260) on the first face (222) of the second substrate (220) includes the steps of:
forming a back electrode-used material layer (242) on the first face (222) of the second substrate (220);
forming a pattern on the back electrode-used material layer (242) to form a back electrode layer (240) that exposes a portion of the second substrate (220); and
forming the absorbing layer (260) on the back electrode layer (240) so that the absorbing layer (260) exposes a portion of the back electrode layer (240) and a portion of the first face (222) of the second substrate (220).

4. The method according to claim 1, further comprising a step of forming the conductive paste between the first and second substrates (210, 220) using a screen printing step or a dispensing step.

5. The method according to claim 1, wherein the step of joining together the first and second substrates (210, 220) includes the step of using hot pressing.

6. The method according to claim 1, further including a step of providing an isolative layer between the first and second substrates (210, 220).

7. The method according to claim 1, wherein the joining device (14) includes:
a positioning module (140) for taking a positioning step for positioning the first substrate (210) relative to the second substrate (220) and providing a positioning signal based on the positioning step; and
a hot pressing module (142) for receiving the positioning signal and accordingly taking a hot pressing step to join together the first and second substrates (210, 220), wherein the first face (212) of the first substrate (210) is in contact with the first face (222) of the second substrate (220).

8. The method according to claim 1, wherein the step of joining together the first and second substrates (210, 220) by hot pressing includes the steps of:
forming an absorbing layer (260) on the first substrate (210);
forming a buffering layer (250) on the absorbing layer (260) formed on the first substrate (210);
forming a transparent electrode layer (230) on the second substrate (220);
forming a buffering layer (250) on the transparent electrode layer (230) formed on the second substrate (220); and
joining the buffering layer (250) formed on the absorbing layer (260) formed on the first substrate (210) with the buffering layer (250) formed on the transparent electrode layer (230) formed on the second substrate (220) by hot pressing.

9. The method according to claim 1, wherein the step of joining together the first and second substrates (210, 220) by hot pressing includes the step of taking one of the steps of:
forming a buffering layer (250) on the transparent electrode layer (230) formed on the first substrate (210) and joining the buffering layer (250) with the second substrate (220) by hot pressing; and
forming a buffering layer (250) on the absorbing layer (260) formed on the second substrate (220) and joining the buffering layer (250) with the first substrate (210) by hot pressing.

10. The method according to claim 1, wherein the step of joining together the first and second substrates (210, 220) includes the step of taking one of the steps of:
providing the first substrate with material layers that can be joined together by hot pressing to form a buffering layer and joining the buffering layer with the second substrate; and
providing the second substrate with material layers that can be joined together by hot pressing to form a buffering layer and joining the buffering layer with the first substrate.

11. A method for making a solar cell, the method including the steps of:
providing a first substrate (210) with first and second faces (212, 214);
providing a second substrate (220) with first and second faces (222, 224);
providing a first coating device (10) for forming a transparent electrode layer (230) on the first face (212) of the first substrate (210);
providing a second coating device (12) for forming an absorbing layer (260) on the first face (222) of the second substrate (220); and
providing a joining device (14) for joining together the first and second substrates (210, 220) by joining the transparent electrode layer (230) with the absorbing layer (260),
wherein the step of forming the transparent electrode layer (230) on the first face (212) of the first substrate includes the steps of:
forming a transparent conductive material layer (232) on the first face (212) of the first substrate;
forming a coating-resisting material layer (280) on the second face (214) of the first substrate (210);

forming a buffering material layer (252) on the coating-resisting material layer (280) and the transparent conductive material layer (232);

removing the coating-resisting material layer (280) so that the buffering material layer (252) exposes a portion of the transparent conductive material layer (232), and forming a pattern on the transparent conductive material layer (232) and the buffering material layer (252) to respectively form the transparent electrode layer (230) and the buffering layer (250) so that the transparent electrode layer (230) exposes a portion of the first substrate (210).

12. The method according to claim 11, wherein the step of forming a pattern on the transparent conductive material layer (232) and the buffering material layer (252) includes the step of using laser scribing.

13. A method for making a solar cell, the method including the steps of:
providing a first substrate (210) with first and second faces (212, 214);
providing a second substrate (220) with first and second faces (222, 224);
providing a first coating device (10) for forming a transparent electrode layer (230) on the first face (212) of the first substrate (210);
providing a second coating device (12) for forming an absorbing layer (260) on the first face (222) of the second substrate (220); and
providing a joining device (14) for joining together the first and second substrates (210, 220) by joining the transparent electrode layer (230) with the absorbing layer (260),
wherein the step of forming the transparent electrode layer (230) on the first face (212) of the first substrate includes the steps of:
forming a transparent conductive material layer (232) on the first face (212) of the first substrate;
forming a coating-resisting material layer (280) on the second face (214) of the first substrate (210);
forming a buffering material layer (252) on the transparent conductive material layer (232) formed on the first face (212) of the first substrate (210);
forming a pattern on the transparent conductive material layer (232) and the buffering material layer (252) to respectively form the transparent electrode layer (230) and the buffering layer (250), wherein the transparent conductive material layer (232) exposes a portion of the first substrate (210), wherein the buffering layer (250) exposes a potion of the transparent electrode layer (230).

14. The method according to claim 13, wherein the step of forming a pattern on the transparent conductive material layer (232) and the buffering material layer (252) includes the step of using laser scribing.

15. The method according to claim 13, wherein the step of forming the buffering material layer (252) includes the step of using chemical bath deposition.

16. The method according to claim 13, further including the step of forming an additional buffering layer (250) on the absorbing layer (260), wherein the step of forming the absorbing layer (260) and the additional buffering layer (250) on the first face (222) of the second substrate includes the steps of:
forming a back electrode-used material layer (242) on the first face (222) of the second substrate (220);
forming a pattern on the back electrode-used material layer (242) to form a back electrode layer (240) that exposes a portion of the second substrate (220); and
forming an absorbing material layer (262) on the back electrode layer (240) so that the absorbing material layer (262) is in contact with the first face (222) of the second substrate (220);
forming an additional coating-resisting material layer (280) on the second face (224) of the second substrate (220);
forming an additional buffering material layer (252) on the absorbing material layer (262); and
forming a pattern on the additional buffering material layer (252) and the additional coating-resisting material layer (280) to respectively form an additional buffering layer (250) and an additional absorbing layer (260) that expose a portion of the back electrode layer (240).

17. The method according to claim 16, wherein the step of forming the additional buffering material layer (252) includes the step of using chemical bath deposition.

* * * * *